United States Patent
Otsuka

(10) Patent No.: US 7,938,587 B2
(45) Date of Patent: May 10, 2011

(54) SUBSTRATE PROCESSING METHOD, COMPUTER STORAGE MEDIUM AND SUBSTRATE PROCESSING SYSTEM

(75) Inventor: Takahisa Otsuka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 184 days.

(21) Appl. No.: 12/393,572

(22) Filed: Feb. 26, 2009

(65) Prior Publication Data

US 2009/0225285 A1  Sep. 10, 2009

(30) Foreign Application Priority Data

Mar. 6, 2008 (JP) .................. 2008-055743

(51) Int. Cl.
*G03D 5/00* (2006.01)
*G03C 5/00* (2006.01)
*G01B 11/04* (2006.01)
*G01B 11/14* (2006.01)
*H05B 1/02* (2006.01)

(52) U.S. Cl. .......... 396/611; 430/30; 356/625; 356/636; 219/494

(58) Field of Classification Search .................. 396/611; 355/27; 430/30; 356/625, 635, 636; 219/444.1, 219/494

See application file for complete search history.

(56) References Cited

U.S. PATENT DOCUMENTS

| 6,072,162 | A | * | 6/2000 | Ito et al. ...................... 219/444.1 |
| 7,094,994 | B2 | * | 8/2006 | Oyama et al. ............... 219/444.1 |
| 2009/0008381 | A1 | * | 1/2009 | Jyousaka et al. ............. 219/494 |
| 2009/0181316 | A1 | * | 7/2009 | Weichert et al. ................ 430/30 |

FOREIGN PATENT DOCUMENTS

| JP | 2004-134723 | 4/2004 |
| JP | 2006-228816 | 8/2006 |
| JP | 2007-311469 | 11/2007 |

* cited by examiner

*Primary Examiner* — Alan A Mathews
(74) *Attorney, Agent, or Firm* — Oblon, Spivak, McClelland, Maier & Neustadt, L.L.P.

(57) ABSTRACT

In the present invention, when dense and sparse resist patterns are formed above a substrate, respective resist pattern dimensions are measured, and a correction value for a first processing unit is calculated based on the dimension measurement result of the dense resist pattern and a correction value for a second processing unit is calculated based on the dimension measurement result of the sparse resist pattern. Based on these calculation results, processing conditions in the first processing unit and the second processing unit are changed, and thereafter processing in these processing units are implemented under these changed conditions.

15 Claims, 11 Drawing Sheets (a)

(b)

(c)

SUBSTRATE PROCESSING METHOD, COMPUTER STORAGE MEDIUM AND SUBSTRATE PROCESSING SYSTEM

BACKGROUND OF THE INVENTION

1. Field of the Invention

The present invention relates to a substrate processing method, a program and a computer storage medium, and a substrate processing system for performing photolithography processing on a substrate such as a semiconductor wafer or the like, and particularly to a method of forming resist patterns in predetermined target dimensions above the substrate when dense and sparse resist patterns are formed in a mixed manner above the substrate.

2. Description of the Related Art

In photolithography processing in manufacture of a semiconductor device, for example, a resist coating treatment of applying a resist solution onto a semiconductor wafer (hereinafter, referred to as a "wafer") to forms a resist film, exposure processing of exposing a predetermined pattern to light on the resist film, post-exposure baking processing (hereinafter, referred to as "PEB processing") of perform heating in order to accelerate the chemical reaction of the resist film after the exposure processing, a developing treatment of developing the exposed resist film and so on are performed in sequence to form a predetermined resist pattern above the wafer.

The above-described resist pattern is used to determine a pattern form of a processing film thereunder and thus needs to be formed in an exact dimension. For this end, it has been proposed that photolithography processing is performed to form a resist pattern above the wafer, the dimension of the resist pattern is measured and, based on the dimension measurement result, processing conditions of heat processing such as the PEB processing and so on are corrected to make the dimension of the resist pattern appropriate (Japanese Patent Application Laid-open No. 2006-228816).

SUMMARY OF THE INVENTION

As shown in FIG. 12, a dense resist pattern P1 and a sparse resist pattern P2 are possibly formed in a mixed manner above a wafer W. More specifically, the resist pattern P1 having a greater ratio of a width L of a line portion 211 as a resist portion where the resist remains to a width S of a space portion 210 that is a portion where the resist is dissolved (hereinafter, referred to as an "L/S ratio"), and the resist pattern P2 having a smaller L/S ratio sometimes exist in a mixed manner. Usually, the resist pattern P2 has a higher reactivity than the resist pattern P1, so that, for example, when the wafer W is heated at a predetermined temperature in the heat processing, the variation in dimension of the resist pattern P2 becomes greater than the variation in dimension of the resist pattern P1.

In the case where the resist patterns P1 and P2 having different L/S ratios exist above the wafer W in a mixed manner as described above, if the heating temperature of the PEB processing is corrected, for example, based on the dimension measurement result of the resist pattern P1 by the method disclosed in the prior art, the dimension of the resist pattern P1 can be made a predetermined target dimension, but sometimes the dimension of the resist pattern P2 cannot be made a predetermined target dimension. Similarly, if the heating temperature of the PEB processing is corrected based on the dimension measurement result of the resist pattern P2, the dimension of the resist pattern P2 can be made a predetermined target dimension, but sometimes the dimension of the resist pattern P1 cannot be made a predetermined target dimension. Accordingly, it has been difficult to make both the dimensions of the resist patterns P1 and P2 appropriate at the same time.

The present invention has been made in consideration of the above points, and its object is to form resist patterns in predetermined target dimensions even when dense and sparse resist patterns are formed in a mixed manner above a substrate.

The present invention is a substrate processing method of performing at least first processing and second processing on a substrate to form, above the substrate, a first resist pattern and a second resist pattern different in dimension of a resist portion and/or a space portion in the resist pattern, the method including the steps of: performing the at least first processing and second processing to form the first resist pattern and the second resist pattern above the substrate; subsequently, measuring the dimension of each of the resist portion and/or the space portion in the first resist pattern and the second resist pattern; and subsequently, correcting a processing condition in the first processing and correcting a processing condition in the second processing based on the measured dimensions, wherein thereafter, the first processing and the second processing are performed under the corrected processing conditions respectively to form the first resist pattern and the second resist pattern in respective predetermined target dimensions.

Note that measuring the dimension of each of the resist portion and/or the space portion in the first resist pattern and the second resist pattern means measuring the dimension(s) of the resist portion or the space portion or both of them, and concretely means measuring the dimension of the line width of the resist portion and the width of the space portion, the side wall angle of the resist portion, or the diameter of the contact hole.

Because correction has conventionally been performed only for one processing based on the dimension measurement result(s) of the resist portion and/or the space portion in either one of the resist patterns as described above, the one resist pattern could be formed in a predetermined target dimension but the other resist pattern could not be formed in a predetermined target pattern. According to the present invention, the processing conditions of the first processing and the second processing can be corrected respectively, based on the dimension measurement results of the resist portions and/or the space portions in the first resist pattern and the second resist pattern. Thus, thereafter, the first processing and the second processing can be performed under the corrected conditions respectively, so that both the first resist pattern and the second resist pattern above the substrate can be formed in the respective predetermined target dimensions.

Note that for correcting the above-described processing conditions of the first processing and the second processing, various methods can be used. For example, a method is used in which, for example, the correlation between the respective processing conditions of the first processing and the second processing and the dimension(s) of the resist portion and/or the space portion in the first resist pattern, and the correlation between the respective processing conditions of the first processing and the second processing and the dimension(s) of the resist portion and/or the space portion in the second resist pattern, are stored as data in advance. In this case, the processing conditions of the first processing and the second processing can be corrected respectively using the above-described correlations based on the dimension measurement results of the resist portions and/or the spaced portions in the first resist pattern and the second resist pattern.

Since the dimensions of the resist portions and/or the space portions are different in the first resist pattern and the second resist pattern, the first resist pattern and the second resist pattern are different in reactivity. Through use of the difference in reactivity, when the dimensions of the resist portions and/or the space portions in the first resist pattern and the second resist pattern are the widths of the resist portions and the widths of the space portions respectively, and the ratio of the width of the resist portion to the width of the space portion in the first resist pattern is greater than the ratio of the width of the resist portion to the width of the space portion in the second resist pattern, and the second processing is processing in which the width of the resist portion and the width of the space portion in the first resist pattern do not change but only the width of the resist portion and the width of the space portion in the second resist pattern change, then the processing condition of the first processing may be corrected based on the measurement results of the width of the resist portion and the width of the space portion in the first resist pattern, and the processing condition of the second processing may be corrected based on the measurement results of the width of the resist portion and the width of the space portion in the second resist pattern and on variations in width of the resist portion and in width of the space portion in the second resist pattern due to the correction of the processing condition of the first processing.

The present invention according to another aspect provides a computer-readable storage medium storing a program running on a computer of a control unit which controls a substrate processing system in order to cause the substrate processing system to execute the substrate processing method.

The present invention according to still another aspect is a substrate processing system for performing at least first processing and second processing on a substrate to form, above the substrate, a first resist pattern and a second resist pattern different in dimension of a resist portion and/or a space portion in the resist pattern, the system including: a first processing unit for performing the first processing; a second processing unit for performing the second processing; a pattern dimension measuring unit for measuring the dimension of the first resist pattern and the dimension of the second resist pattern above the substrate; and a control unit for performing a control such that the at least first processing and second processing are performed in the first processing unit and the second processing unit to form the first resist pattern and the second resist pattern above the substrate, subsequently the dimension of each of the resist portion and/or the space portion in the first resist pattern and the second resist pattern is measured, subsequently a processing condition in the first processing and a processing condition in the second processing are corrected based on the measured dimensions, and thereafter the first processing unit and the second processing unit perform the first processing and the second processing under the corrected processing conditions respectively to form the first resist pattern and the second resist pattern in respective predetermined target dimensions.

According to the present invention, even when dense and sparse resist patterns are formed in a mixed manner above a substrate, the respective resist patterns can be formed in predetermined target dimensions in a series of photolithography processing.

DETAILED DESCRIPTION OF THE INVENTION

Figure 1:
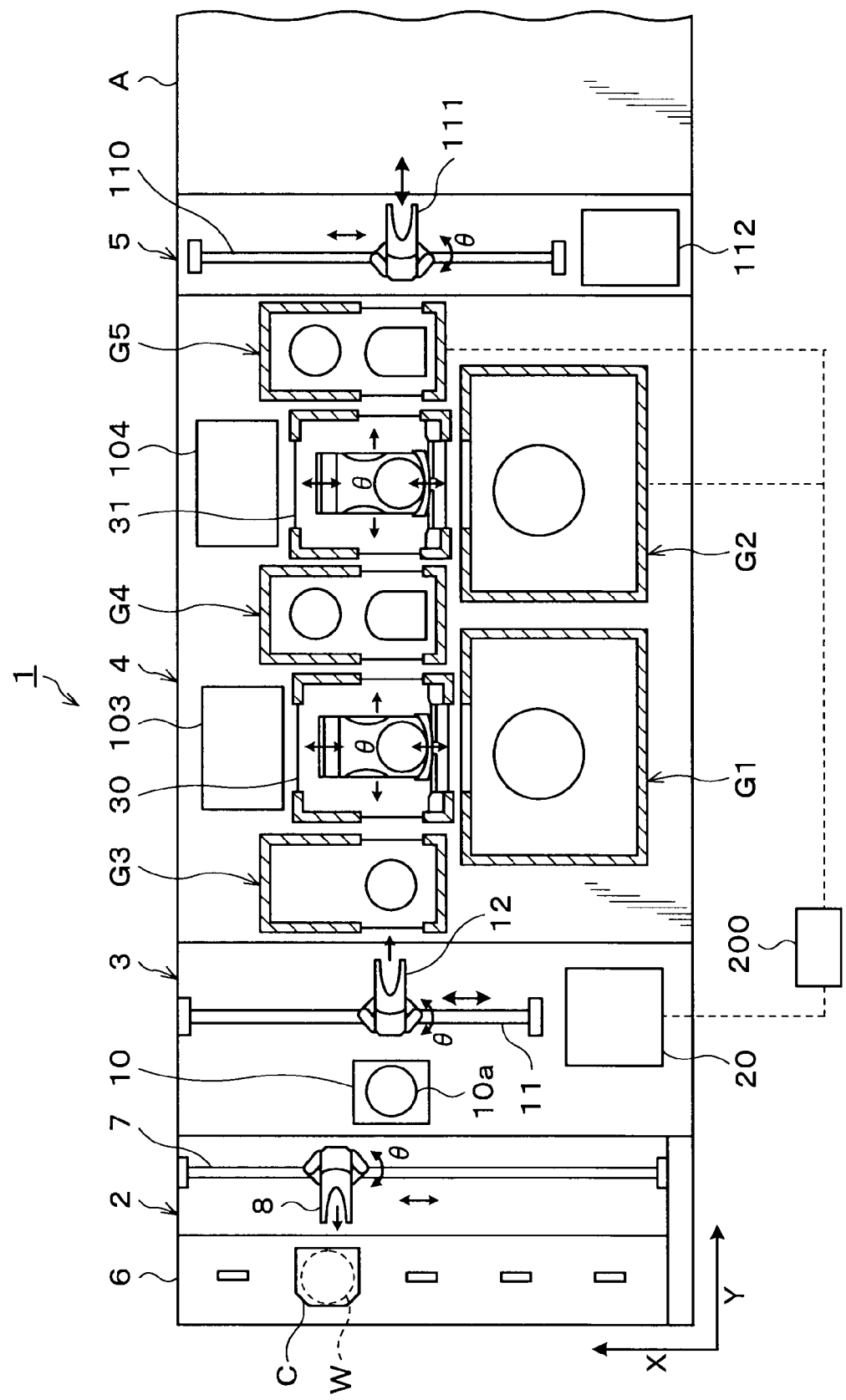
FIG. 1 is a plan view showing the outline of a configuration of a coating and developing treatment system according to this embodiment.
Figure 2:
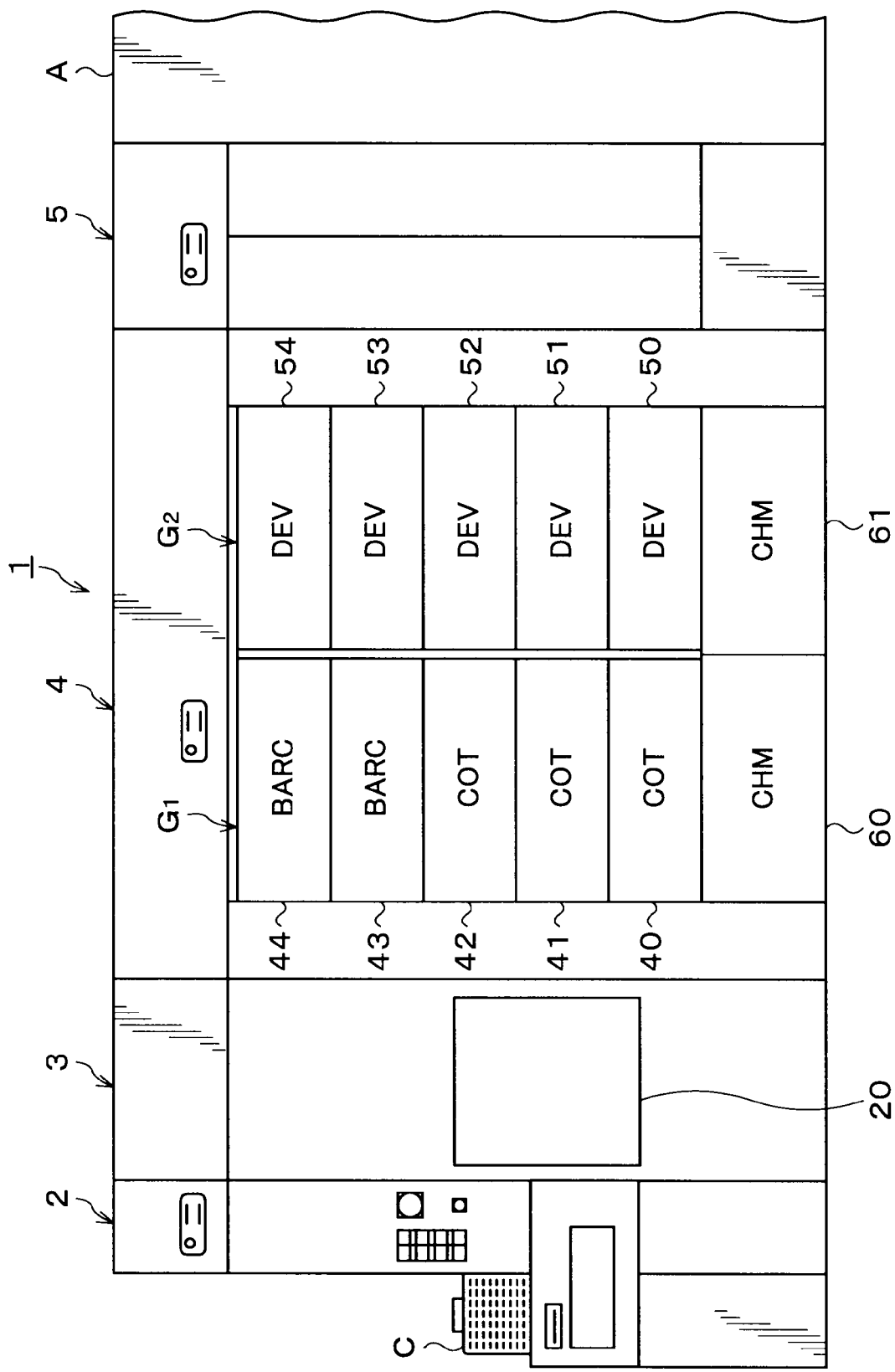
FIG. 2 is a front view of the coating and developing treatment system according to this embodiment.
Figure 3:
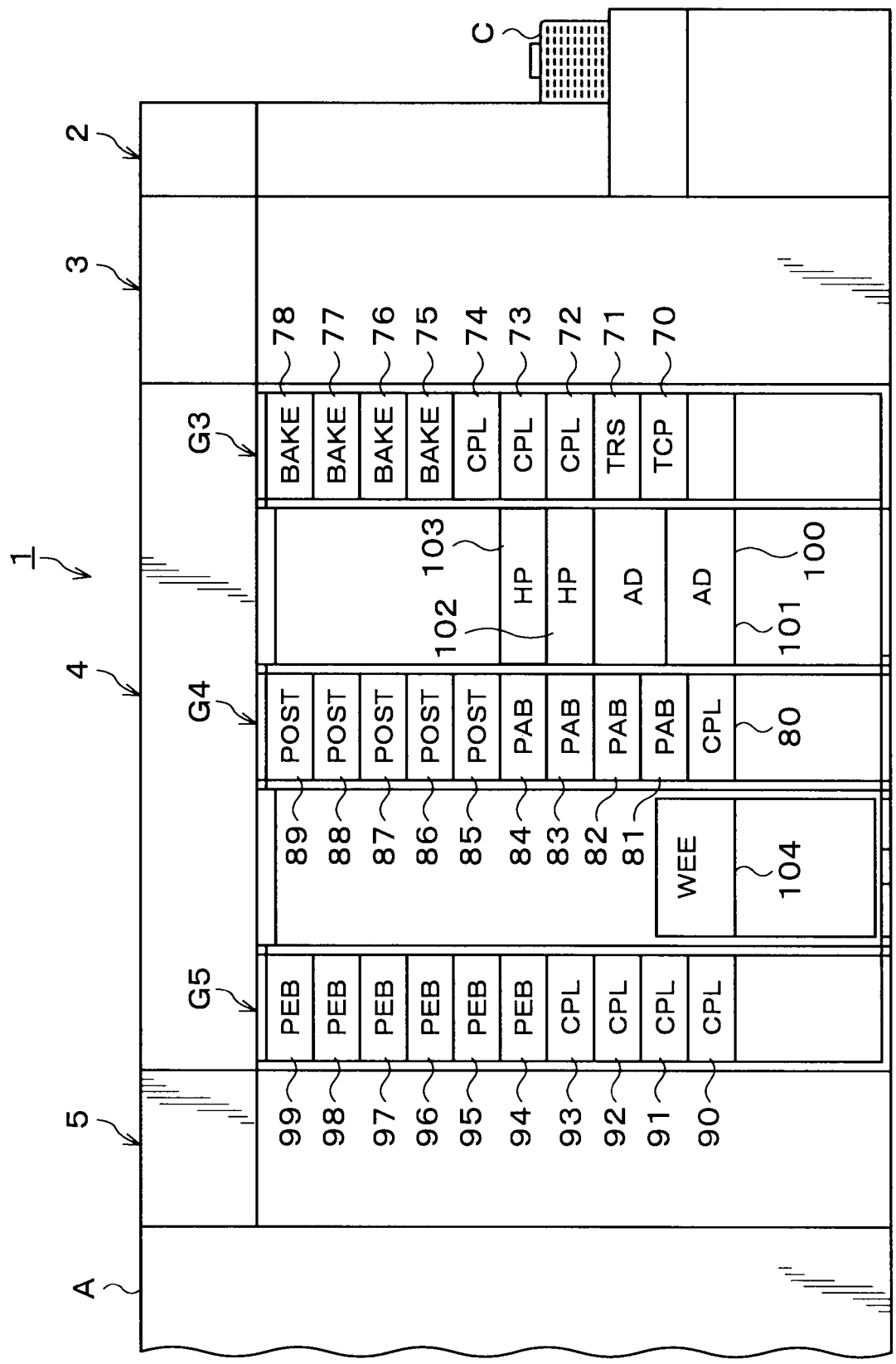
FIG. 3 is a rear view of the coating and developing treatment system according to this embodiment.

Hereinafter, preferred embodiments of the present invention will be described. FIG. 1 is a plan view showing the outline of a configuration of a coating and developing treatment system 1 as a substrate processing system according to this embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; an inspection station 3 for performing a predetermined inspection on the wafer W; a processing station 4 including a plurality of various kinds of processing and treatment units, which are multi-tiered, for performing predetermined processing or treatment in a manner of single wafer processing in a photolithography process; and an interface section 5 for passing the wafer W to/from an aligner A provided adjacent to the processing station 4, are integrally connected.

In the cassette station 2, a cassette mounting table 6 is provided such that a plurality of cassettes C can be mounted on the cassette mounting table 6 in a line in an X-direction (a top-to-bottom direction in FIG. 1). In the cassette station 2, a wafer transfer body 8 is provided which is movable in the X-direction on a transfer path 7. The wafer transfer body 8 is also movable in a wafer-arrangement direction of the wafers W housed in the cassette C (a Z-direction; the vertical direction), and thus can selectively access the wafers W arranged in the vertical direction in each of the cassettes C. The wafer transfer body 8 is rotatable around an axis in the vertical direction (a θ-direction) and can also access a later-described transition unit 10 on the inspection station 3 side.

In the inspection station 3 adjacent to the cassette station 2, a pattern dimension measuring unit 20 is provided which measures the dimensions of a resist portion and/or a space portion in a resist pattern (hereinafter, referred to as "resist pattern dimension") above the wafer W. The pattern dimension measuring unit 20 is disposed, for example, on the negative direction side in the X-direction (the downward direction in FIG. 1) in the inspection station 3. For example, on the cassette station 2 side in the inspection station 3, the transition unit 10 is disposed for passing the wafer W to/from the cassette station 2. In the transition unit 10, a mounting unit 10a is provided for mounting the wafer W thereon. On the side of the positive direction in the X-direction (the upward direction in FIG. 1) of the pattern dimension measuring unit 20, a wafer transfer unit 12 is provided which is movable in the X-direction on a transfer path 11. The wafer transfer unit 12 is movable, for example, in the vertical direction and also rotatable in the θ-direction, and can access the pattern dimension measuring unit 20, the transition unit 10, and the processing and treatment units in a later-described processing unit group G3 on the processing station 4 side.

The processing station 4 adjacent to the inspection station 3 includes, for example, five processing unit groups G1 to G5 in each of which a plurality of processing and treatment units are multi-tiered. On the side of the negative direction in the X-direction (the downward direction in FIG. 1) in the processing station 4, the first processing unit group G1 and the second processing unit group G2 are placed in order from the inspection station 3 side. On the side of the positive direction in the X-direction (the upward direction in FIG. 1) in the processing station 4, the third processing unit group G3, the fourth processing unit group G4, and the fifth processing unit group G5 are placed in order from the inspection station 3 side. Between the third processing unit group G3 and the fourth processing unit group G4, a first transfer unit 30 is provided. The first transfer unit 30 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 31 is provided. The second transfer unit 31 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 40, 41, and 42 each for applying a resist solution to the wafer W to form a resist film, and bottom coating units 43 and 44 each for forming an anti-reflection film that prevents reflection of light during exposure processing, are five-tiered in order from the bottom. In the second processing unit group G2, solution treatment units, for example, developing treatment units 50 to 54 each for supplying a developing solution to the wafer W to perform developing treatment are five-tiered in order from the bottom. Further, chemical chambers 60 and 61 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, a temperature regulating unit 70, a transition unit 71 for passing the wafer W, high-precision temperature regulating units 72 to 74 each for regulating the wafer temperature under temperature control with a high precision, and high-temperature thermal processing units 75 to 78 each for heat-processing the wafer W at a high temperature, are nine-tiered in order from the bottom.

In the fourth processing unit group G4, for example, a high-precision temperature regulating unit 80, pre-baking units (hereinafter, referred to as "PAB units") 81 to 84 each for heat-processing the wafer W after the resist coating treatment, and post-baking units (hereinafter, referred to as "POST units") 85 to 89 each for heat-processing the wafer W after the developing treatment, are ten-tiered in order from the bottom.

In the fifth processing unit group G5, a plurality of thermal processing units each for thermally processing the wafer W, for example, high-precision temperature regulating units 90 to 93, and post-exposure baking units (hereinafter, referred to as "PEB units") 94 to 99 as a plurality of first processing units, are ten-tiered in order from the bottom.

As shown in FIG. 1, on the side of the positive direction in the X-direction of the first transfer unit 30, a plurality of processing and treatment units are arranged, for example, adhesion units 100 and 101 each for performing hydrophobic treatment on the wafer W and heat-processing units 102 and 103 each for heat-processing the wafer W being four-tiered in order from the bottom as shown in FIG. 3. As shown in FIG. 1, on the side of the positive direction in the X-direction of the second transfer unit 31, for example, an edge exposure unit 104 is disposed which selectively exposes only the edge portion of the wafer W to light.

In the interface station 5, for example, a wafer transfer body 111 moving on a transfer path 110 extending in the X-direction and a buffer cassette 112 are provided as shown in FIG. 1. The wafer transfer body 111 is movable in the Z-direction and also rotatable in the θ-direction and thus can access the aligner A adjacent to the interface station 5, the buffer cassette 112, and the fifth processing unit group G5 and transfer the wafer W to them.

Figure 4:
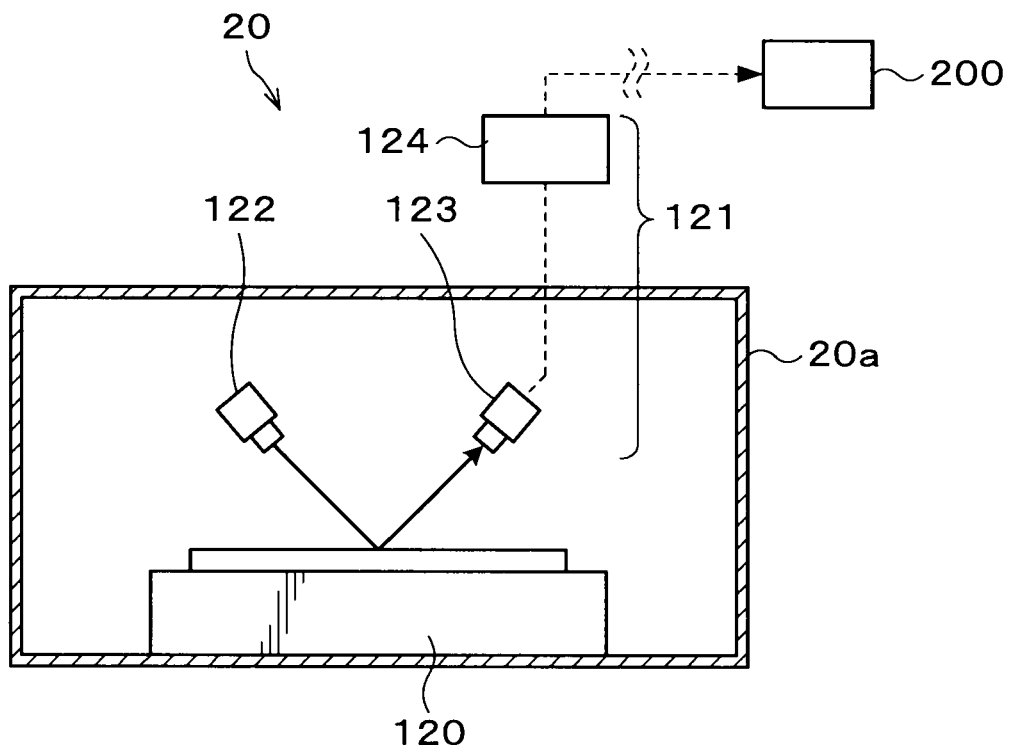
FIG. 4 is a longitudinal sectional view of the outline of a configuration of a pattern dimension measuring unit.

Next, a configuration of the above-described pattern dimension measuring unit 20 will be described. The pattern dimension measuring unit 20 has, for example, a casing 20a having a transfer-in/out port (not shown) for the wafer W formed at its side surface as shown in FIG. 4. In the casing 20a, a mounting table 120 for horizontally mounting the wafer W and an optical profilometer 121 are provided. The mounting table 120 is movable, for example, in two dimensional directions in the horizontal directions. The optical profilometer 121 includes, for example, a light applying unit 122 for applying light to the wafer W from an oblique direction, a light detecting unit 123 for detecting the light applied from the light applying unit 122 and reflected off the wafer W, and a measuring unit 124 for calculating the resist pattern dimension above the wafer W based on the information on the light received by the light detecting unit 123. The pattern dimension measuring unit 20 is for measuring the resist pattern dimension using, for example, the Scatterometry method, and the measuring unit 124 can measure the resist pattern dimension by matching the light intensity distribution within the wafer detected by the light detecting unit 123 to a virtual light intensity distribution stored in advance to obtain the resist pattern dimension corresponding to the matched virtual light intensity distribution. Note that as the resist pattern dimension, for example, the line width of a resist portion (the width of a space portion), the side wall angle of the resist portion, or the diameter of a contact hole is measured is measured.

Figure 5:
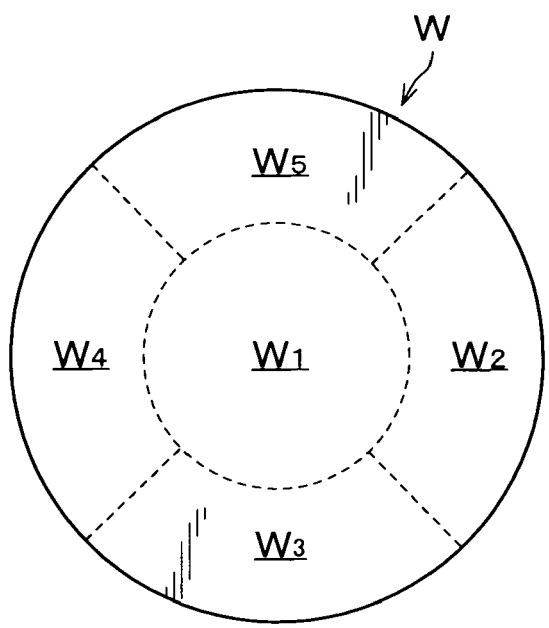
FIG. 5 is an explanatory view showing divided wafer regions.

By moving the wafer W relative to the light applying unit 122 and the light detecting unit 123, the pattern dimension measuring unit 20 can measure the resist pattern dimension in each of a plurality of regions within the wafer, for example, wafer regions $W_1$ to $W_5$ as shown in FIG. 5. Note that the wafer regions $W_1$ to $W_5$ correspond to thermal plate regions $R_1$ to $R_5$ in later-described PEB units 94 to 99.

Figure 6:
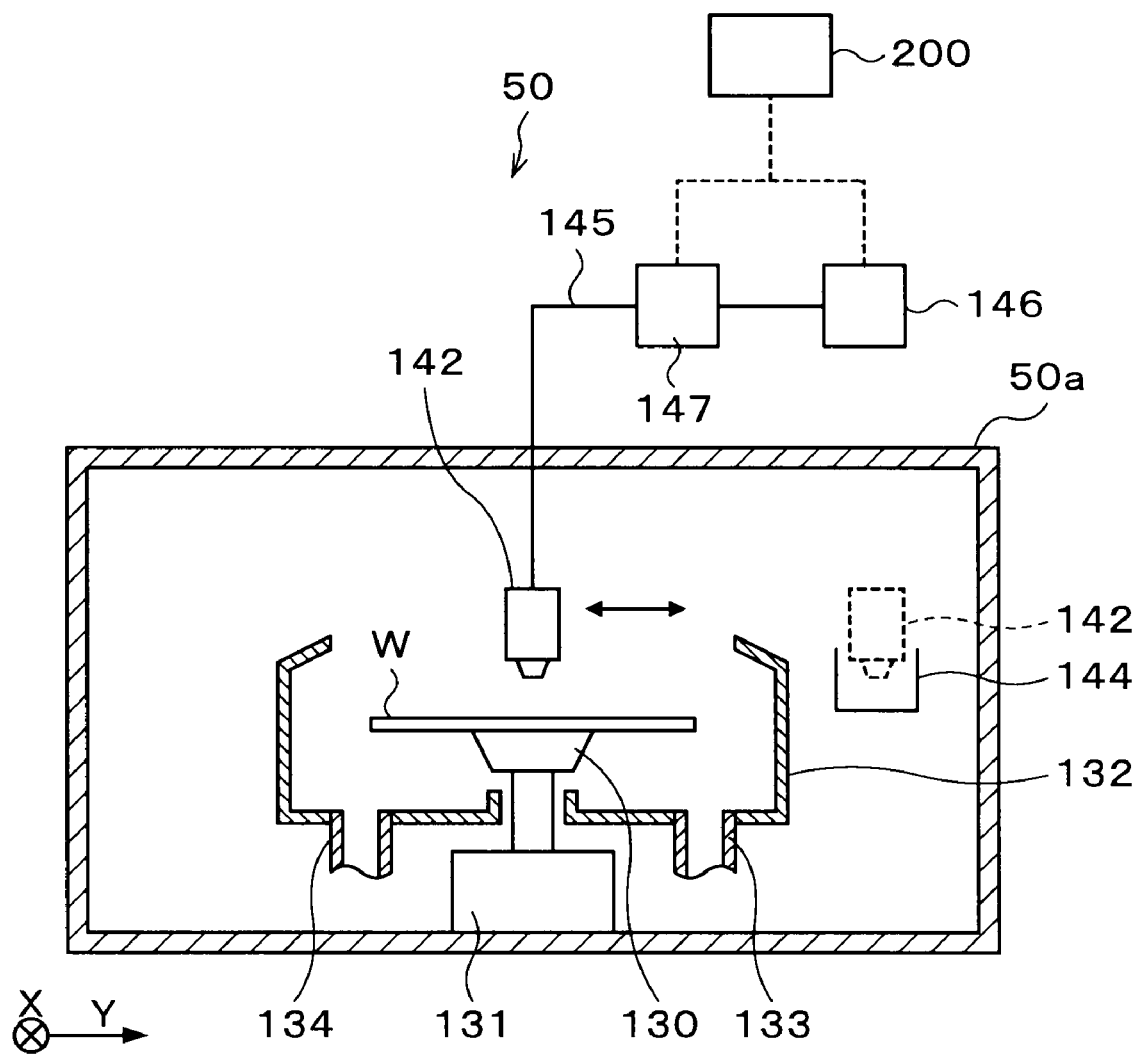
FIG. 6 is a longitudinal sectional view showing the outline of a configuration of a developing treatment unit.

Next, the configurations of the above-described developing treatment units 50 to 54 will be described. The developing treatment unit 50 has, for example, a casing 50a having a transfer-in/out port (not shown) for the wafer W formed at its side surface as shown in FIG. 6. In the casing 50a, a spin chuck 130 is provided at the central portion which holds and rotates the wafer W thereon. The spin chuck 130 has a horizontal upper surface, and the upper surface is provided with, for example, a suction port (not shown) which sucks the wafer W. Suction through the suction port allows the wafer W to be sucked on the spin chuck 130.

The spin chuck 130 is provided with a chuck drive mechanism 131 for rotating and raising and lowering the spin chuck 130. The chuck drive mechanism 131 is equipped with, for example, a rotation drive unit (not shown) such as a motor or the like which rotates the spin chuck 130 around its axis in the vertical direction at a predetermined speed, and a raising and lowering drive unit (not shown) such as a motor or a cylinder which raises and lowers the spin chuck 130. The chuck drive mechanism 131 can be used to raise and lower the wafer W on the spin chuck 130 at a predetermined timing and rotate the wafer W at a predetermined speed.

Around the spin chuck 130, a cup 132 is provided which receives and collects liquid splashing or dropping from the wafer W. A drain pipe 133 for draining the collected liquid and an exhaust pipe 134 for exhausting the atmosphere in the cup 132 are connected to the bottom surface of the cup 132.

Figure 7:
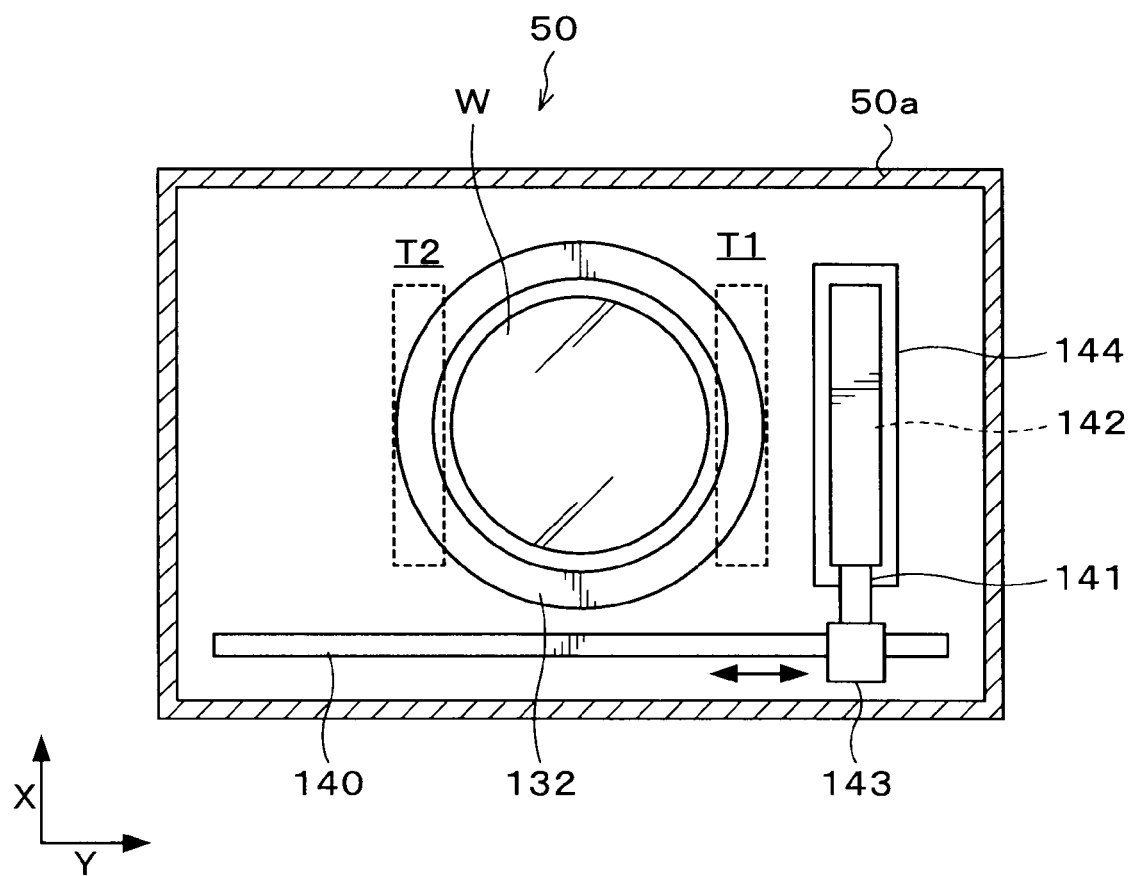
FIG. 7 is a transverse sectional view showing the outline of the configuration of the developing treatment unit.

As shown in FIG. 7, on the side of the negative direction in an X-direction (the lower direction in FIG. 7) of the cup 132, a rail 140 is formed which extends along a Y-direction (the right-to-left direction in FIG. 7). The rail 140 is formed, for example, from the outside on the negative direction side in the Y-direction of the cup 132 (the left direction in FIG. 7) to the outside on the positive direction side in the Y-direction of the cup 132 (the right side in FIG. 7). To the rail 140, an arm 141 is attached.

On the arm 141, a developing solution supply nozzle 142 is supported which discharges the developing solution. The developing solution supply nozzle 142 has an elongated shape along the X-direction that is, for example, equal to or longer than the diameter dimension of the wafer W. The developing solution supply nozzle 142 has a plurality of discharge ports (not shown) formed at its bottom portion in a line along the longitudinal direction and thus can uniformly discharge the developing solution from the discharge ports. Note that the discharge time of the developing solution to be discharged from the developing solution supply nozzle 142 is controlled, for example, by a later-described control unit 200 as shown in FIG. 6.

The arm 141 is freely movable on the rail 140 by means of a nozzle drive unit 143 shown in FIG. 7. This allows the developing solution supply nozzle 142 to move from a waiting section 144 provided on the outside on the positive direction side in the Y-direction of the cup 132 to the negative direction side in the Y-direction of the cup 132. Further, the arm 141 freely rises and lowers by means of the nozzle drive unit 143 to be able to adjust the height of the developing solution supply nozzle 142. The developing solution supply nozzle 142 is connected to a developing solution supply source 146 via a supply pipe 145 as shown in FIG. 6. The supply pipe 145 is provided with a temperature regulating unit 147 for regulating the temperature of the developing solution supplied from the developing solution supply source 146. Note that the temperature of the developing solution regulated by the temperature regulating unit 147 is controlled by the later-described control unit 200.

Note that the configurations of the developing treatment units 51 to 54 are the same as that of the above-described developing treatment unit 50 and therefore the description thereof will be omitted.

Figure 8:
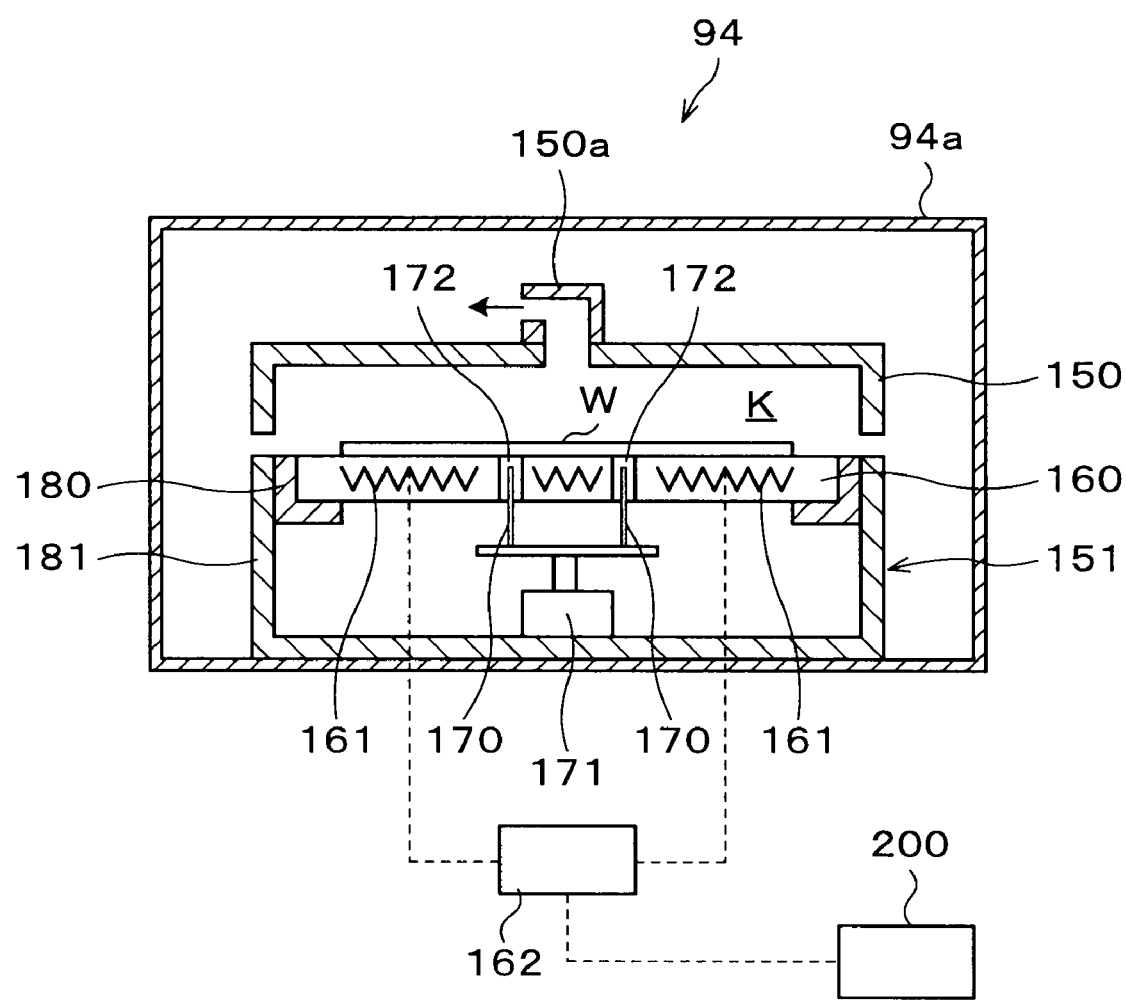
FIG. 8 is a longitudinal sectional view showing the outline of a configuration of a PEB unit.

Next, the configurations of the aforementioned PEB units 94 to 99 will be described. The PEB unit 94 has a casing 94a having a transfer-in/out port (not shown) for the wafer W formed at its side surface as shown in FIG. 8. In the casing 94a, a lid body 150 that is located on the upper side and vertically movable, and a thermal plate accommodating part 151 that is located on the lower side and forms a processing room K together with the lid body 150, are provided.

The lid body 150 has an almost cylindrical shape with a lower face open. The central portion of the upper surface of the lid body 150 is provided with an exhaust portion 150a. The atmosphere in the processing room K is uniformly exhausted through the exhaust portion 150a.

Figure 9:
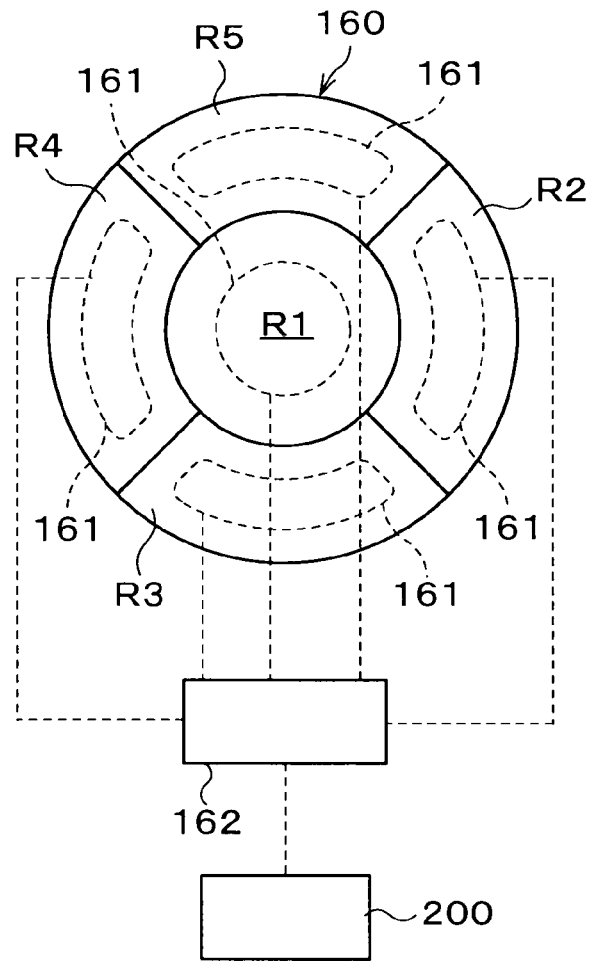
FIG. 9 is a plan view showing a configuration of a thermal plate in the PEB unit.

A thermal plate 160 is divided into a plurality of, for example, five thermal plate regions $R_1$, $R_2$, $R_3$, $R_4$, and $R_5$ as shown in FIG. 9. The thermal plate 160 is divided, for example, into a circular thermal plate region $R_1$ located at the central portion as seen in plan view and thermal plate regions $R_2$ to $R_5$ which are made by equally dividing the peripheral portion around the thermal plate region $R_1$ into four sectors.

A heater 161 generating heat by power feeding is individually embedded in each of the thermal plate regions $R_1$ to $R_5$ of the thermal plate 160 and can heat each of the thermal plate regions $R_1$ to $R_5$. The heating value of each of the heaters 161 of the thermal plate regions $R_1$ to $R_5$ is adjusted by a temperature controller 162. The temperature controller 162 can adjust the heating value of the heater 161 to control the temperature of each of the thermal plate regions $R_1$ to $R_5$ to a predetermined heating temperature. The setting of the heating temperature in the temperature controller 162 is performed, for example, by the later-described control unit 200.

As shown in FIG. 8, raising and lowering pins 170 for supporting the wafer W from below and raising and lowering the wafer W are provided below the thermal plate 160. The raising and lowering pins 170 are vertically movable by means of a raising and lowering drive mechanism 171. Through holes 172 penetrating through the thermal plate 160 in the thickness direction are formed near the central portion of the thermal plate 160, so that the raising and lowering pins 170 can rise from below the thermal plate 160 and pass through the through holes 172 to project to above the thermal plate 160.

The thermal plate accommodating part 151 includes, for example, an annular holding member 180 for accommodating the thermal plate 160 and holding the outer peripheral portion of the thermal plate 160, and a support ring 181 almost in a cylindrical shape surrounding the outer periphery of the holding member 180.

Note that the configurations of the PEB units 95 to 99 are the same as that of the above-described PEB unit 94, and therefore description thereof will be omitted.

Next, the control unit 200 will be described which controls processing conditions such as the temperature of the developing solution by the temperature regulating unit 147 and the discharge time of the developing solution from the developing solution supply nozzle 142 in the above-described developing treatment units 50 to 54, the heating temperature of the temperature controller 162 in the PEB units 94 to 99 and so on. The control unit 200 is composed of, for example, a general-purpose computer including a CPU and a memory.

Figure 10:
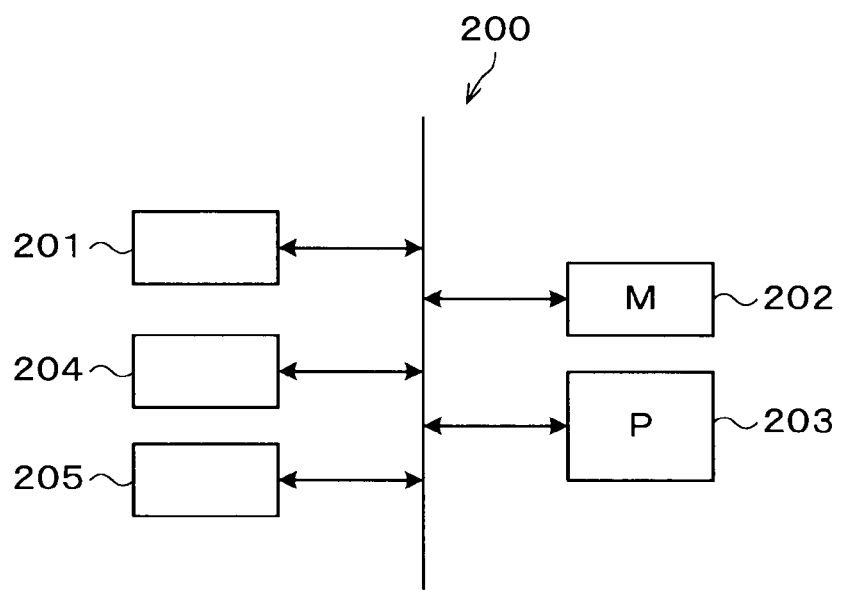
FIG. 10 is a block diagram showing a configuration of a control unit.

The control unit 200 has, for example, as shown in FIG. 10, an input part 201 into which the dimension measurement results, for example, from the pattern dimension measuring unit 20 are inputted; a data storage part 202 for storing various kinds of information required to calculate the processing conditions of the developing treatment units 50 to 54 and the PEB units 94 to 99 from the dimension measurement results; a program storage part 203 for storing a program P for calculating the processing conditions; a computing part 204 for executing the program P to calculate the processing conditions; and an output part 205 for outputting the calculated processing conditions to the developing treatment units 50 to 54 and the PEB units 94 to 99.

Figure 11:
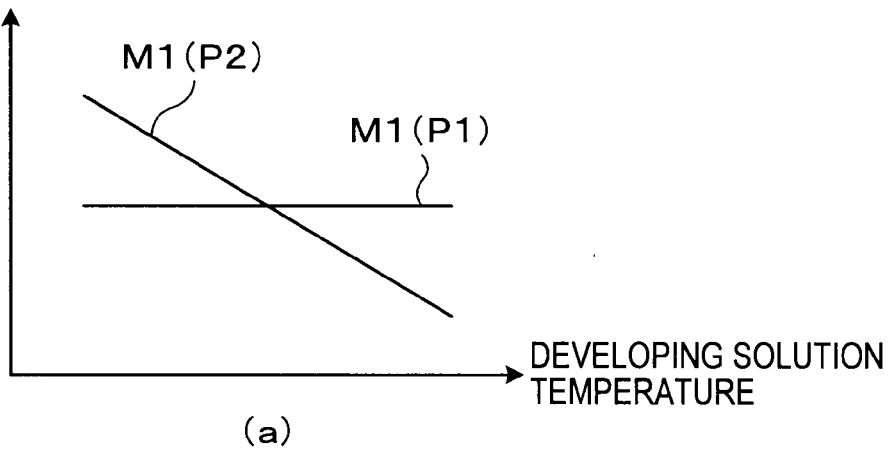
FIG. 11 shows graphs indicating correlations between the resist pattern dimension and processing conditions of respective processing, (a) indicating a correlation to the developing solution temperature; (b) indicating a correlation to the developing solution discharge time; and (c) indicating a correlation to the heating temperature in the PEB processing.
Figure 11:
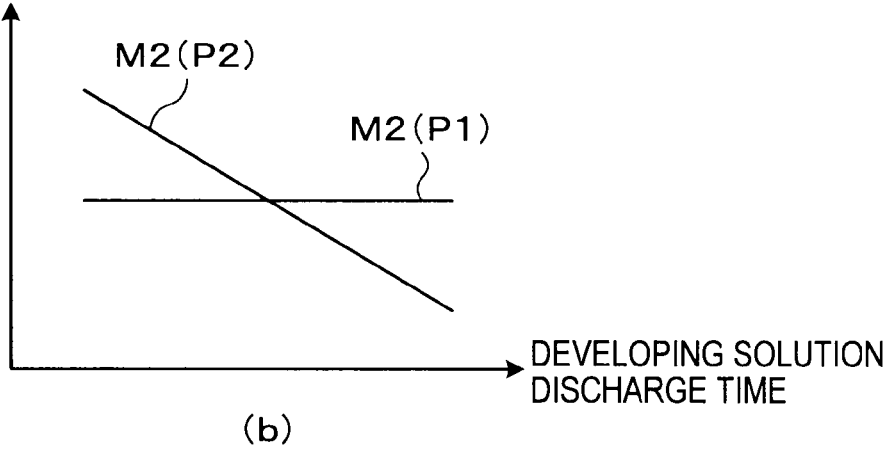
Figure 11:
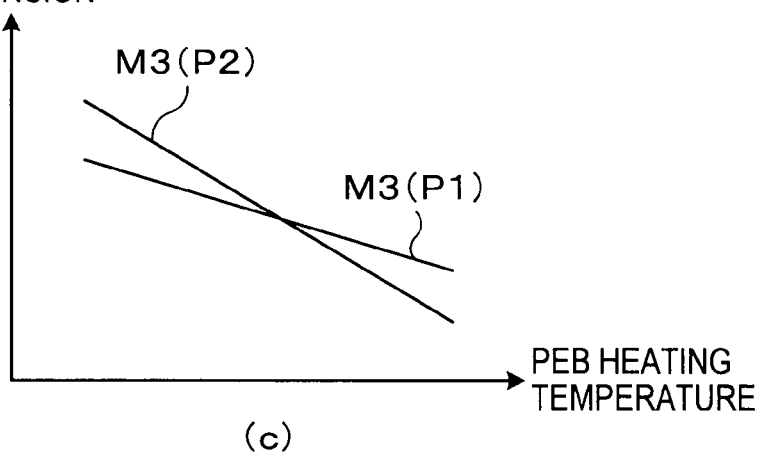

The data storage part 202 stores, for example, as shown in FIG. 11, data (FIG. 11 (a)) indicating a correlation M1 between the temperature of the developing solution by the temperature regulating unit 147 in the developing treatment units 50 to 54 and the resist pattern dimension; data (FIG. 11 (b)) indicating a correlation M2 between the discharge time of the developing solution from the developing solution supply nozzle 142 and the resist pattern dimension; and data (FIG. 11 (c)) indicating a correlation M3 between the heating temperature by the temperature controller 162 in the PEB units 94 to 99 and the resist pattern dimension.

Figure 12:
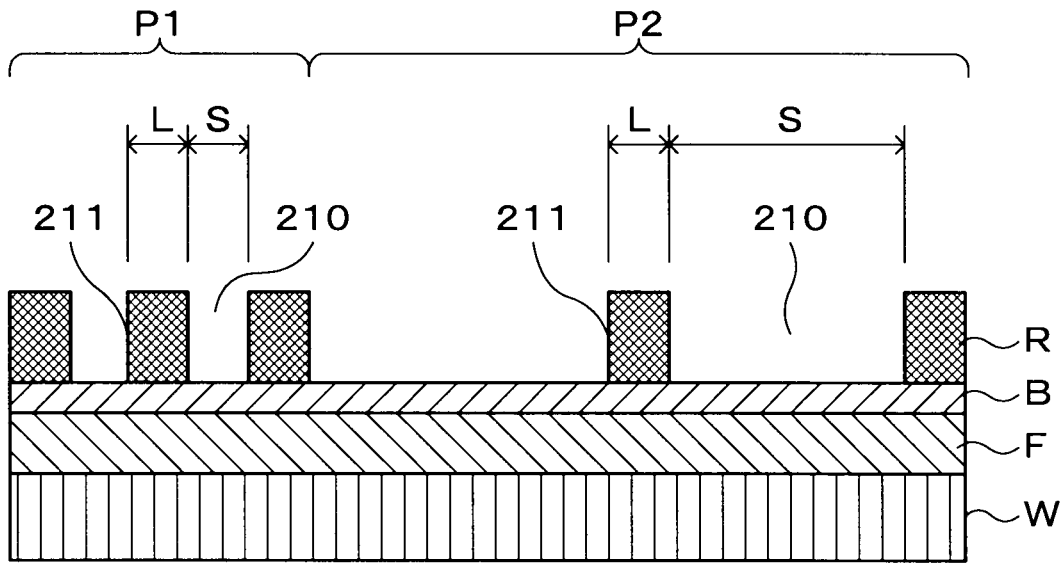
FIG. 12 is a longitudinal sectional view showing resist patterns above the wafer.

In this embodiment, as the resist pattern above the wafer W, a dense resist pattern P1 as a first resist pattern and a sparse resist pattern P2 as a second resist pattern are formed in a mixed manner as shown in FIG. 12. More specifically, the resist pattern P1 having a first L/S ratio that is a greater L/S ratio, the L/S ratio being a ratio of a width L of a line portion 211 as a resist portion to a width S of a space portion 210, and the resist pattern P2 having a second L/S ratio smaller than the first L/S ratio exist in a mixed manner. The first L/S ratio of the resist pattern P1 is, for example, 1/1, and the second L/S ratio of the resist pattern P2 is, for example, 1/5.

With the formation of such dense and sparse resist patterns P1 and P2, the correlations M1 to M3 shown in FIG. 11(a) to FIG. 11(c) have been created for each of the resist patterns P1 and P2. Since the resist pattern P2 has a higher reactivity than the resist pattern P1, the variation in dimension of the resist pattern P2 with respect to change in the PEB temperature is greater than the variation in dimension of the resist pattern P1 (FIG. 11(c)). Further, the dimension of the resist pattern P2 changes with the change in the developing solution temperature or the change in the developing solution discharge time, whereas the dimension of the resist pattern P1 hardly changes (FIG. 11(a), (b)).

When the dimension measurement results of the resist patterns P1 and P2 are inputted from the pattern dimension measuring unit 20 into the input part 201, the correction value for the heating temperature in the PEB units 94 to 99 is calculated by the program P stored in the program storage part 203 using the correlation M3 based on the dimension measurement result of the resist pattern P1 in the control unit 200. The calculation result is outputted from the output part 205 to the PEB units 94 to 99. Accordingly, the wafer W is heated under the calculated heating condition, whereby the dimension of the resist pattern P1 is adjusted to a predetermined target dimension.

Next, the correction value for the temperature of the developing solution or the discharge time of the developing solution in the developing treatment units 50 to 54 is calculated using the correlation M1 or M2 based on the dimension measurement result of the resist pattern P2 from the pattern dimension measuring unit 20 and on the variation in the dimension of the resist pattern P2 due to the correction value for the heating temperature in the PEB units 94 to 99. The calculation result is outputted from the output part 205 to the developing treatment units 50 to 54. Accordingly, the developing solution is discharged to the wafer W under the calculated condition of the developing solution, whereby the dimension of the resist pattern P2 is adjusted to a predetermined target dimension. Note that in this case, the dimension of the resist pattern P1 hardly changes as described above.

Note that the program P to realize the function of the control unit 200 may be one recorded on a computer-readable storage medium such as a computer-readable hard disk (HD), flexible disk (FD), compact disk (CD), magneto-optical disk (MO), or a memory card, and installed from the storage medium into the control unit 200.

Figure 13:
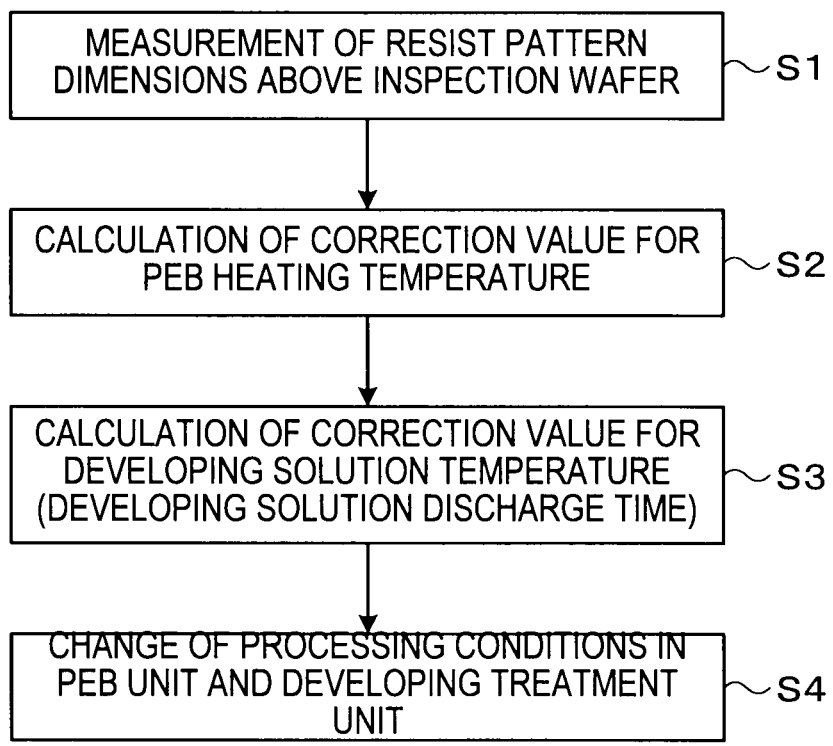
FIG. 13 is a flowchart showing the steps of correcting the heating temperature in the PEB unit and the developing solution temperature (the developing solution discharge time) in the developing treatment unit.

Next, the process of processing the wafer W in the coating and developing treatment system 1 configured as described above will be described with inspection processing using an inspection wafer W'. FIG. 13 is a flowchart showing the steps of correcting the heating temperature in the PEB units 94 to 99 and the developing solution temperature or the developing solution discharge time in the developing treatment units 50 to 54. Note that, as the resist pattern to be formed above the wafer W, the dense resist pattern P1 and the sparse resist pattern P2 will be formed in a mixed manner as shown in FIG. 12 in this embodiment.

First, a series of photolithography processing is performed on the inspection wafer W' by the coating and developing treatment system 1 to form the resist patterns P1 and P2 above the inspection wafer W'. Details of the photolithography processing will be described in later-described processing of the wafer W. The inspection wafer W' above which the resist patterns P1 and P2 have been formed is transferred to the pattern dimension measuring unit 20 in the inspection station 3.

In the pattern dimension measuring unit 20, the inspection wafer W' is mounted on the mounting table 120 as shown in FIG. 4. Next, light is applied from the light applying unit 122 to a predetermined portion of the inspection wafer W', its reflected light is detected by the light detecting unit 123, and the dimensions of the resist patterns P1 and P2 above the inspection wafer W', such as the line widths of the resist portions (the widths of the space portions), the side wall angles of the resist portions, or the diameters of the contact holes, are measured in the measuring unit 124 (Step S1 in FIG. 13). The measurement results of the dimensions of the resist patterns P1 and P2 above the inspection wafer W' are outputted to the control unit 200.

In the control unit 200, the correction value for the heating temperature in the PEB units 94 to 99 is first calculated by the program P using the correlation M3 shown in FIG. 11(c) based on the dimension measurement result of the resist pattern P1 from the pattern dimension measuring unit 20 (Step S2 in FIG. 13). Then, the correction value for the temperature of the developing solution or the discharge time of the developing solution in the developing treatment units 50 to 54 is calculated using the correlation M1 or M2 based on the dimension measurement result of the resist pattern P2 from the pattern dimension measuring unit 20 and on the variation in the dimension of the resist pattern P2 due to the correction value for the heating temperature in the PEB units 94 to 99 (Step S3 in FIG. 13). These calculation results are outputted to the PEB units 94 to 99 and the developing treatment units 50 to 54, so that processing conditions in the respective processing and treatment units are changed (Step S4 in FIG. 13).

Next, a series of processing is performed, for example, on product wafers W. First of all, the wafers W on which a processing film F shown in FIG. 12 has been formed are first taken out of the cassette C on the cassette mounting table 6 one by one by the wafer transfer body 8, and successively transferred to the transition unit 10 in the inspection station 3. The wafer W transferred to the transition unit 10 is transferred by the wafer transfer unit 12 to the processing station 4 and subjected to processing of forming a resist pattern. The wafer W is first transferred, for example, to the temperature regulating unit 70 included in the third processing unit group G3 in the processing station 4 and temperature-regulated to a predetermined temperature, and then transferred by the first transfer unit 30 to the bottom coating unit 43, where an anti-reflection film B is formed as shown in FIG. 12. The wafer W is then transferred by the first transfer unit 30 to the heat-processing unit 102, the high-temperature thermal processing unit 75, and the high-precision temperature regulating unit 80 in succession, in each of the processing units the wafer W is subjected to predetermined processing. The wafer W is then transferred by the first transfer unit 30 to the resist coating unit 40.

In the resist coating unit 40, a predetermined amount of resist solution is applied, for example, to the front surface of the rotated wafer W, and the resist solution is spread over the entire front surface of the wafer W to form a resist film R shown in FIG. 12 above the wafer W.

The wafer W above which the resist film has been formed is transferred by the first transfer unit 30, for example, to the PAB unit 81 and subjected to heat processing, and then transferred by the second transfer unit 31 to the edge exposure unit 104 and the high-precision temperature regulating unit 93 in sequence so that the wafer W is subjected to predetermined processing in each of the units. Thereafter, the wafer W is transferred by the wafer transfer body 111 in the interface station 5 to the aligner A where a predetermined pattern is exposed, for example, in the resist film above the wafer W. The wafer W for which exposure processing has been finished is transferred by the wafer transfer body 111 to the PEB unit 94 in the processing station 4.

The wafer W transferred to the PEB unit 94 is delivered to the raising and lowering pins 170 which have been raised and waiting in advance, and after the lid body 150 is closed, the raising and lowering pins 170 are lowered to mount the wafer W on the thermal plate 160 as shown in FIG. 8. In this event, the thermal plate 160 has been heated to a predetermined temperature corrected by the control unit 200. The wafer W is then heated to the predetermined temperature by the heated thermal plate 160. Note that the thermal plate regions $R_1$ to $R_5$ of the thermal plate 160 may be heated to different temperatures. In this case, the wafer regions $W_1$ to $W_5$ corresponding to them are heated at the different temperatures, respectively.

The wafer W for which the heat processing in the PEB unit has been finished is transferred by the second transfer unit 31 to the high-precision temperature regulating unit 91 and temperature-regulated there, and then transferred to the developing treatment unit 50.

The wafer W transferred to the developing treatment unit 50 is delivered to the spin chuck 130 which has been raised and waiting in advance, and the spin chuck 130 is lowered so that the wafer W is suction-held on the spin chuck 130 as shown in FIG. 6. Subsequently, as shown in FIG. 7, the developing solution supply nozzle 142 waiting at the waiting section 144 is moved to the negative direction side in the Y-direction down to a position T1 (a dashed line in FIG. 7) before an end portion of the wafer W on the positive direction side in the Y-direction. Thereafter, the developing solution is discharged from the developing solution supply nozzle 142, and the developing solution supply nozzle 142 is moved to a position T2 (a dashed line in FIG. 7) at an end portion of the wafer W on the negative direction side in the Y-direction while discharging the developing solution. This develops the resist film R above the wafer W to form the resist patterns P1 and P2 shown in FIG. 12. In this event, the developing solution is heated to the temperature corrected by the control unit 200. If the discharge time of the developing solution from the developing solution supply nozzle 142 has been corrected by the control unit 200, the developing solution supply nozzle 142 is moved at a speed corresponding to the corrected discharge time.

The wafer W above which the resist patterns P1 and P2 have been formed in the developing treatment unit 50 is transferred by the second transfer unit 31 to the POST unit 85 and subjected to post-baking, and then transferred by the first transfer unit 30 to the high-precision temperature regulating unit 72 and temperature-regulated.

The wafer W is then is transferred by the first transfer unit 30 to the transition unit 71 and transferred by the wafer transfer unit 12 to the transition unit 10 in the inspection station 3, and returned by the wafer transfer body 8 from the transition unit 10 to the cassette C. Thus, a series of wafer processing in the coating and developing treatment system 1 ends, whereby the resist patterns P1 and P2 in predetermined target dimensions are formed above the wafer W.

According to the above embodiment, since the dimensions of the resist patterns P1 and P2 above the inspection wafer W' are measured first and the correction value for the heating temperature in the PEB units 94 to 99 is then calculated based on the dimension measurement result of the resist pattern P1 above the inspection wafer W' in the control unit 200, the resist pattern P1 above the wafer W to be processed thereafter can be formed in a predetermined target dimension. Further, since the correction value for the temperature of the developing solution or the discharge time of the developing solution in the developing treatment units 50 to 54 is calculated based on the dimension measurement result of the resist pattern P2 above the inspection wafer W' and on the variation in the dimension of the resist pattern P2 due to the correction value for the heating temperature in the PEB units 94 to 99, the resist pattern P2 above the wafer W can be formed in a predetermined target dimension. Accordingly, in a series of photolithography processing, even when the resist patterns P1 and P2 which are different in L/S ratio are formed above the wafer W, the resist patterns P1 and P2 can be formed in the predetermined target dimensions, respectively.

Though the temperature of the developing solution or the discharge time of the developing solution in the developing treatment units 50 to 54 is corrected in the control unit 200 in the above embodiment, the heating temperature, the heating time or the processing atmosphere temperature in the PAB units 81 to 84 may be corrected in the case where it is desired to correct, in particular, the side wall angles among the dimensions of the resist patterns P1 and P2. More specifically, when correction is performed such that the resist patterns P1 and P2 above the wafer W have the predetermined target dimensions, the heating temperature in the PEB units 94 to 99 and the heating temperature, the heating time or the processing atmosphere temperature in the PAB units 81 to 84 are corrected. Note that the configurations of the PAB units 81 to 84 are the same as that of the above-described PEB unit and therefore the description thereof will be omitted.

Figure 14:
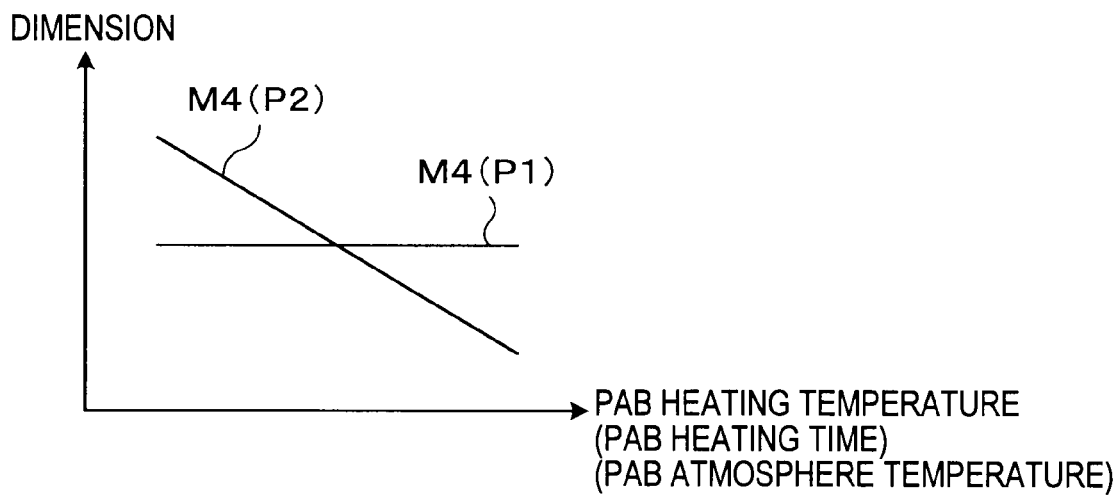
FIG. 14 is a graph showing the correlation between the resist pattern dimension and the heating temperature (the heating time, the atmosphere temperature) in the PAB unit.

The data storage part 202 of the control unit 200 stores data indicating a correlation M4 between the heating temperature (the heating time, the processing atmosphere temperature) in the PAB units 81 to 84 and the resist pattern dimension as shown in FIG. 14. The data is created according to the denseness and sparseness of the resist patterns P1 and P2, in which the dimension of the resist pattern P2 changes, for example, with the change in the heating temperature (the heating time, the processing atmosphere temperature) in the PAB units 81 to 84, whereas the dimension of the resist pattern P1 hardly changes.

In this case, the correction value for the heating temperature in the PEB units 94 to 99 is calculated based on the dimension measurement result of the resist pattern P1 above the inspection wafer W', so that the resist pattern P1 above the wafer W can be formed in a predetermined target dimension. Further, the correction value for the heating temperature, the heating time or the processing atmosphere temperature in the PAB units 81 to 84 is calculated based on the dimension measurement result of the resist pattern P2 above the inspection wafer W' and on the variation in the dimension of the resist pattern P2 due to the correction value for the heating temperature in the PEB units 94 to 99, so that the resist pattern P2 above the wafer W can be formed in a predetermined target dimension.

In the case where it is desired to correct, in particular, the side wall angles among the dimensions of the resist patterns P1 and P2 as in the above-described embodiment, the heating temperature, the heating time or the processing atmosphere temperature in the PAB units 81 to 84 and the temperature of the developing solution or the discharge time of the developing solution in the developing treatment units 50 to 54 may be corrected.

In this case, the heating temperature, the heating time or the processing atmosphere temperature in the PAB units 81 to 84 and the temperature of the developing solution or the discharge time of the developing solution in the developing treatment units 50 to 54 are corrected using the correlation M4 shown in FIG. 14 and the correlation M1 or M2 shown in FIG. 11 (*a*), (*b*) based on the dimension measurement results of the resist patterns P1 and P2 above the inspection wafer W'. Accordingly, the resist patterns P1 and P2 above the wafer W can be formed in predetermined target dimensions.

If contact holes are formed in the resist patterns P1 and P2 above the wafer W, so-called shrinking processing is possibly performed to make the diameter of the contact hole finer. The diameter of the contact hole is the width S of the space portion 210 shown in FIG. 12. In this shrinking processing, a pattern shrinking agent is first applied over the wafer W which has been developed in the developing treatment unit 50. In this event, the pattern shrinking agent is filled also into the contact holes on the resist patterns P1 and P2. Then, heating is performed on the pattern shrinking agent to shrink the pattern shrinking agent and also shrink the contact holes. Thereafter, the pattern shrinking agent is removed, whereby the diameters of the contact holes can be decreased. Note that, for example, an apparatus having the same configuration as those of the resist coating units 40 to 42 is used for the application of the pattern shrinking agent, for example, the POST units 85 to 89 are used for the heating of the pattern shrinking agent, and an apparatus having the same configuration as those of the developing treatment units 50 to 54 is used for the removal of the pattern shrinking agent. The configurations of the POST units 85 to 89 are the same as the configuration of the above-described PEB unit and therefore description thereof will be omitted.

Hence, though the temperature of the developing solution or the discharge time of the developing solution in the developing treatment units 50 to 54 is corrected in the control unit 200 in the above embodiment, the heating temperature, the heating time or the processing atmosphere temperature in the above-described POST units 85 to 89 may be corrected. More specifically, when correction is performed to make the resist patterns P1 and P2 above the wafer W in predetermined target dimensions, the heating temperature in the PEB units 94 to 99 and the heating temperature, the heating time or the processing atmosphere temperature of the shrinking processing in the POST units 85 to 89 are corrected.

Figure 15:
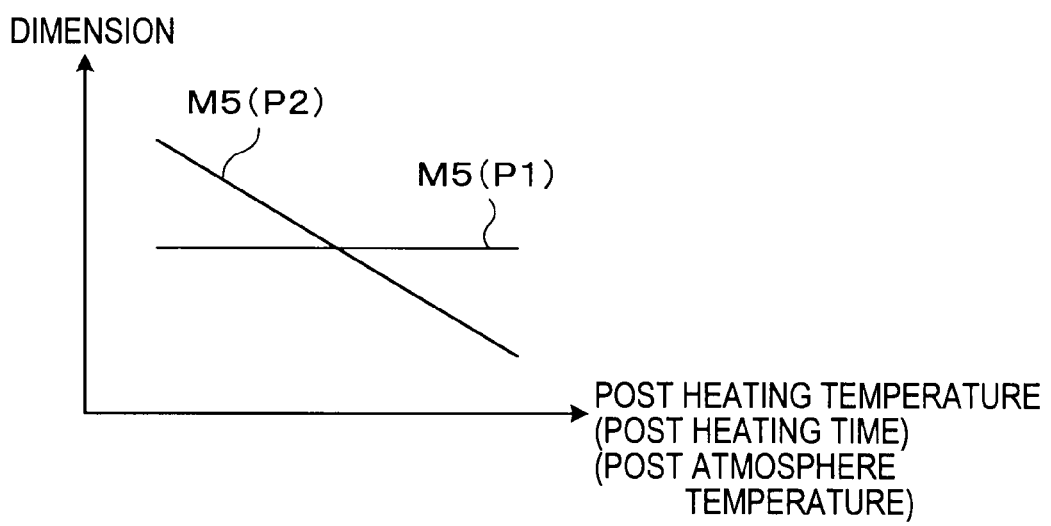
FIG. 15 is a graph showing the correlation between the resist pattern dimension and the heating temperature (the heating time, the processing atmosphere temperature) at the shrinking processing.

The data storage part 202 of the control unit 200 stores data indicating a correlation M5 between the heating temperature (the heating time, the processing atmosphere temperature) at the shrinking processing and the resist pattern dimension as shown in FIG. 15. The data is created according to the denseness and sparseness of the resist patterns P1 and P2, in which the dimension of the resist pattern P2 changes, for example, with the change in the heating temperature (the heating time, the processing atmosphere temperature) in the POST units 85 to 89, whereas the dimension of the resist pattern P1 hardly changes.

In this case, the correction value for the heating temperature in the PEB units 94 to 99 is calculated based on the dimension measurement result of the resist pattern P1 above the inspection wafer W', so that the resist pattern P1 above the wafer W can be formed in a predetermined target dimension. Further, the correction value for the heating temperature, the heating time or the processing atmosphere temperature in the POST units 85 to 89 is calculated based on the dimension measurement result of the resist pattern P2 above the inspection wafer W' and on the variation in the dimension of the resist pattern P2 due to the correction value for the heating temperature in the PEB units 94 to 99, so that the resist pattern P2 above the wafer W can be formed in a predetermined target dimension. Accordingly, the contact hole can be formed in a predetermined diameter.

In the case where it is desired to correct, in particular, the diameters of the contact holes among the dimensions of the resist patterns P1 and P2 as in the above-described embodiment, the heating temperature, the heating time or the processing atmosphere temperature in the POST units 85 to 89 and the temperature of the developing solution or the discharge time of the developing solution in the developing treatment units 50 to 54 may be corrected.

In this case, the heating temperature, the heating time or the processing atmosphere temperature in the POST units 85 to 89 and the temperature of the developing solution or the discharge time of the developing solution in the developing treatment units 50 to 54 are corrected using the correlation M5 shown in FIG. 15 and the correlation M1 or M2 shown in FIG. 11 (*a*), (*b*) based on the dimension measurement results of the resist patterns P1 and P2 above the inspection wafer W'. Accordingly, the contact holes can be formed in predetermined diameters.

Figure 16:
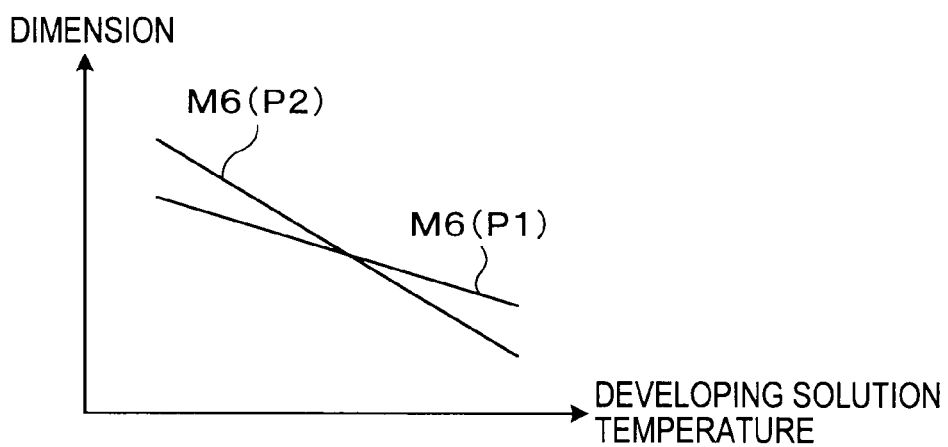
FIG. 16 is a graph showing the correlation between the resist pattern dimensions and the developing solution temperature.

Though the resist pattern P1 is formed with an L/S ratio of 1/1 in the above embodiment, the resist pattern P1 may be formed with an L/S ratio of 1/3. In this case, the correlation M1 between the dimensions of the resist patterns P1 and P2 and the developing solution temperature shown in FIG. 11(*a*) is turned, for example, to a correlation M6 as shown in FIG. 16. In this correlation M6, the dimension of the resist pattern P1 changes as well as the dimension of the resist pattern P2 changes, for example, with the change in the developing solution temperature.

Even in this case, the heating temperature in the PEB units 94 to 99 and the developing solution temperature in the developing treatment units 50 to 54 can be corrected using the correlation M6 shown in FIG. 16 and the correlation M3 shown in FIG. 11(c). Accordingly, by correcting the processing conditions of two different kinds of processing, the resist patterns P1 and P2 can be formed in the respective predetermined target dimensions even when the resist patterns P1 and P2 individually change. Note that the processing conditions of the PEB processing and the developing treatment are corrected in this embodiment, but the present invention is not limited to that, and processing conditions of two other different kinds of processing in the photolithography processing may be corrected. For example, processing conditions such as the exposure amount in the aligner A (the dose amount of light of the exposure light source), the focus at exposure and so on may be corrected.

The dimension of the sparse resist pattern P2 changes with the change in the developing solution temperature but the dimension of the dense resist pattern P1 hardly changes in the above embodiment, but conversely processing may be performed in which the dimension of the dense resist pattern P1 changes but the dimension of the sparse resist pattern P2 hardly changes. Even in this case, by correcting the processing conditions of this processing and the PEB processing, the resist patterns P1 and P2 can be formed in the respective predetermined target dimensions.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to this example but can take various aspects.

Though the dimensions in five regions of the wafer W are measured, for example, in the pattern dimension measuring unit 20 in the above-described embodiment, the number and the shapes of those regions can be arbitrarily selected. Further, the pattern dimension measuring unit 20 is provided in the inspection station 3 in the above embodiment, it may be provided in the processing station 4. Further, the pattern dimension measuring unit 20 may apply, for example, electron beams to the wafer W to capture an image of the front surface of the wafer W to thereby measure the resist pattern dimension within the wafer.

The present invention is also applicable to the case where the substrate is a substrate other than the wafer, such as an FPD (Flat Panel Display), a mask reticle for a photomask, or the like.

The present invention is useful for forming resist patterns above a substrate in predetermined target dimensions when dense and sparse resist patterns are formed in a mixed manner above the substrate.

What is claimed is:

1. A substrate processing method of performing at least first processing and second processing on a substrate to form, above the substrate, a first resist pattern and a second resist pattern different in dimension of a resist portion and/or a space portion in the first and second resist patterns, said method comprising the steps of:

performing the at least first processing and second processing to form the first resist pattern and the second resist pattern above the substrate;

subsequently, measuring the dimension of each of the resist portion and/or the space portion in the first resist pattern and the second resist pattern; and subsequently, correcting a processing condition in the first processing and correcting a processing condition in the second processing based on the measured dimensions, wherein thereafter, the first processing and the second processing are performed under the corrected processing conditions respectively to form the first resist pattern and the second resist pattern in respective predetermined target dimensions.

2. The substrate processing method as set forth in claim 1, wherein the dimensions of the resist portions and/or the space portions in the first resist pattern and the second resist pattern are widths of the resist portions and widths of the space portions, respectively, wherein a ratio of the width of the resist portion to the width of the space portion in the first resist pattern is greater than a ratio of the width of the resist portion to the width of the space portion in the second resist pattern, wherein the second processing is processing in which the width of the resist portion and the width of the space portion in the first resist pattern do not change but only the width of the resist portion and the width of the space portion in the second resist pattern change, wherein the processing condition of the first processing is corrected based on measurement results of the width of the resist portion and the width of the space portion in the first resist pattern, and wherein the processing condition of the second processing is corrected based on measurement results of the width of the resist portion and the width of the space portion in the second resist pattern and on variations in the width of the resist portion and the width of the space portion in the second resist pattern due to the correction of the processing condition of the first processing.

3. The substrate processing method as set forth in claim 1, wherein the first processing is heat processing performed after exposure processing and before developing treatment, and wherein the second processing is the developing treatment.

4. The substrate processing method as set forth in claim 1, wherein the first processing is heat processing performed after exposure processing and before developing treatment, and wherein the second processing is heat processing performed after resist coating treatment and before the exposure processing.

5. The substrate processing method as set forth in claim 1, wherein the first processing is heat processing performed after exposure processing and before developing treatment, and wherein the second processing is heat processing after the developing treatment.

6. The substrate processing method as set forth in claim 1, wherein the dimensions of the resist portions and/or the space portions in the first resist pattern and the second resist pattern are side wall angles of the respective resist portions, wherein the first processing is heat processing performed after resist coating treatment and before exposure processing, and wherein the second processing is developing treatment.

7. The substrate processing method as set forth in claim 1, wherein the dimensions of the resist portions and/or the space portions in the first resist pattern and the second resist pattern are diameters of respective contact holes, wherein the first processing is heat processing after developing treatment, and wherein the second processing is the developing treatment.

8. A non-transitory computer-readable storage medium storing a program running on a computer of a control unit which controls a substrate processing system in order to cause the substrate processing system to execute a substrate processing method,
said substrate processing method being a substrate processing method of performing at least first processing and second processing on a substrate to form, above the substrate, a first resist pattern and a second resist pattern different in dimension of a resist portion and/or a space portion in the first and second resist patterns, said method comprising the steps of:
performing the at least first processing and second processing to form the first resist pattern and the second resist pattern above the substrate;
subsequently, measuring the dimension of each of the resist portion and/or the space portion in the first resist pattern and the second resist pattern; and
subsequently, correcting a processing condition in the first processing and correcting a processing condition in the second processing based on the measured dimensions,
wherein thereafter, the first processing and the second processing are performed under the corrected processing conditions respectively to form the first resist pattern and the second resist pattern in respective predetermined target dimensions.

9. A substrate processing system for performing at least first processing and second processing on a substrate to form, above the substrate, a first resist pattern and a second resist pattern different in dimension of a resist portion and/or a space portion in the first and second resist patterns, said system comprising:
a first processing unit for performing the first processing;
a second processing unit for performing the second processing;
a pattern dimension measuring unit for measuring the dimension of the first resist pattern and the dimension of the second resist pattern above the substrate; and
a control unit for performing a control such that the at least first processing and second processing are performed in said first processing unit and said second processing unit to form the first resist pattern and the second resist pattern above the substrate, subsequently the dimension of each of the resist portion and/or the space portion in the first resist pattern and the second resist pattern is measured, subsequently a processing condition in the first processing and a processing condition in the second processing are corrected based on the measured dimensions, and thereafter said first processing unit and said second processing unit perform the first processing and the second processing under the corrected processing conditions respectively to form the first resist pattern and the second resist pattern in respective predetermined target dimensions.

10. The substrate processing system as set forth in claim 9, wherein the dimensions of the resist portions and/or the space portions in the first resist pattern and the second resist pattern are widths of the resist portions and widths of the space portions, respectively,
wherein a ratio of the width of the resist portion to the width of the space portion in the first resist pattern is greater than a ratio of the width of the resist portion to the width of the space portion in the second resist pattern,
wherein said second processing unit performs processing in which the width of the resist portion and the width of the space portion in the first resist pattern do not change but only the width of the resist portion and the width of the space portion in the second resist pattern change, and
wherein said control unit corrects the processing condition of the first processing based on measurement results of the width of the resist portion and the width of the space portion in the first resist pattern, and corrects the processing condition of the second processing based on measurement results of the width of the resist portion and the width of the space portion in the second resist pattern and on variations in the width of the resist portion and the width of the space portion in the second resist pattern due to the correction of the processing condition of the first processing.

11. The substrate processing system as set forth in claim 9, wherein said first processing unit performs heat processing performed after exposure processing and before developing treatment, and said second processing unit performs the developing treatment.

12. The substrate processing system as set forth in claim 9, wherein said first processing unit performs heat processing performed after exposure processing and before developing treatment, and said second processing unit performs heat processing performed after resist coating treatment and before the exposure processing.

13. The substrate processing system as set forth in claim 9, wherein said first processing unit performs heat processing performed after exposure processing and before developing treatment, and said second processing unit performs heat processing after the developing treatment.

14. The substrate processing system as set forth in claim 9, wherein the dimensions of the resist portions and/or the space portions in the first resist pattern and the second resist pattern are side wall angles of the respective resist portions, and
wherein said first processing unit performs heat processing performed after resist coating treatment and before exposure processing, and said second processing unit performs developing treatment.

15. The substrate processing system as set forth in claim 9, wherein the dimensions of the resist portions and/or the space portions in the first resist pattern and the second resist pattern are diameters of respective contact holes, and
wherein said first processing unit performs heat processing after developing treatment, and said second processing unit performs the developing treatment.

* * * * *